(12) United States Patent
Kim

(10) Patent No.: US 9,173,288 B1
(45) Date of Patent: Oct. 27, 2015

(54) FOLDABLE DISPLAY APPARATUS

(71) Applicant: LG DISPLAY CO., LTD., Seoul (KR)

(72) Inventor: Yong Hee Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/558,420

(22) Filed: Dec. 2, 2014

(30) Foreign Application Priority Data

Sep. 1, 2014 (KR) .................. 10-2014-0115740

(51) Int. Cl.

| | | |
|---|---|---|
| *G06F 1/16* | (2006.01) | |
| *H05K 5/00* | (2006.01) | |
| *H05K 1/02* | (2006.01) | |
| *H05K 7/14* | (2006.01) | |
| *H05K 7/00* | (2006.01) | |
| *H05K 9/00* | (2006.01) | |
| *H05K 1/00* | (2006.01) | |
| *E05D 7/00* | (2006.01) | |
| *E05F 1/08* | (2006.01) | |
| *E05D 3/06* | (2006.01) | |
| *G06F 3/041* | (2006.01) | |

(52) U.S. Cl.
CPC ............. *H05K 1/028* (2013.01); *G06F 1/162* (2013.01); *G06F 1/1616* (2013.01); *G06F 1/1618* (2013.01); *G06F 1/1622* (2013.01); *G06F 1/1633* (2013.01); *G06F 1/1637* (2013.01); *G06F 1/1641* (2013.01); *G06F 1/1647* (2013.01); *G06F 1/1652* (2013.01); *H05K 5/0017* (2013.01); *H05K 7/1427* (2013.01); *H05K 2201/055* (2013.01)

(58) Field of Classification Search
CPC ...... G06F 1/1616; G06F 1/1618; G06F 1/162; G06F 1/1622; G06F 1/1633; G06F 1/1637; G06F 1/1641; G06F 1/1647; G06F 1/1652; G06F 2203/04102
USPC ............ 361/679.01, 679.04, 679.05, 679.06, 361/679.07, 679.21, 679.22, 679.26, 361/679.27, 679.28, 749; 174/378, 525, 174/254; 16/221, 302, 366; 345/173; 455/575.1, 575.3
See application file for complete search history.

(56) References Cited

U.S. PATENT DOCUMENTS

| | | |
|---|---|---|
| 2003/0043095 A1 | 3/2003 | Silverbrook |
| 2012/0314399 A1 | 12/2012 | Bohn et al. |
| 2013/0010405 A1 | 1/2013 | Rothkopf et al. |
| 2014/0042293 A1* | 2/2014 | Mok et al. ............. 248/682 |
| 2014/0133076 A1 | 5/2014 | Verschoor et al. |

* cited by examiner

*Primary Examiner* — Hoa C Nguyen
*Assistant Examiner* — Binh Tran
(74) *Attorney, Agent, or Firm* — Dentons US LLP

(57) ABSTRACT

Disclosed is a foldable display apparatus which can maintain a bending part of an unfolded flexible display in a plane state. The foldable display apparatus includes a display panel arranged in a folded or unfolded position with respect to a bending part which is defined in a display area displaying an image, a first panel supporting part configured to support a first side of the display panel, a second panel supporting part configured to support a second side of the display panel, and a connection housing configured to overlap the bending part, and movably support a second side of each of the first and second panel supporting parts.

20 Claims, 9 Drawing Sheets

FOLDABLE DISPLAY APPARATUS

CROSS-REFERENCE TO RELATED APPLICATIONS

This application claims the benefit of the Korean Patent Application No. 10-2014-0115740 filed on Sep. 1, 2014, which is hereby incorporated by reference for all purposes as if fully set forth herein.

BACKGROUND OF THE INVENTION

1. Field of the Invention

The present invention relates to a foldable display apparatus. More particularly, the present invention relates to a foldable display apparatus which is folded or unfolded with respect to a bending part defined in a display panel.

2. Discussion of the Related Art

A display apparatus using a flat display panel, such as a liquid crystal display (LCD) apparatus, a plasma display apparatus, an organic light emitting display apparatus, an electrophoretic display apparatus, or an electro-wetting display apparatus, is generally applied to notebook computers, portable electronic devices, televisions (TVs), and monitors.

Recently, even in portable electronic devices, the demand for a large screen has been increasing. Thus, an apparatus including a display unit displaying a large screen is being developed and commercialized by connecting a flat display panel. In particular, foldable display apparatuses using the merits of a flexible display panel which is bendable or foldable provide portable convenience and include a display unit which displays a large screen. Thus, such devices are attracting much attention as next-generation technology of the display field. The foldable display apparatus may be applied to various fields such as TVs and monitors, in addition to portable electronic devices such as mobile communication terminals, electronic notes, e-books, portable multimedia players (PMPs), navigation devices, ultra mobile personal computers (PCs), mobile phones, smartphones, tablet PCs.

Examples of foldable display apparatuses may include a flexible display apparatus disclosed in U.S. Patent Publication No. 2013/0010405 (hereinafter referred to as a prior art reference). The flexible display apparatus disclosed in the prior art reference unfolds a flexible display with respect to a hinge having a link structure, thereby providing a large screen.

However, the flexible display apparatus disclosed in the prior art reference cannot stably maintain a bending curvature of a folded flexible display due to an empty space between housings caused by the hinge having the link structure, and cannot maintain a bending display area of an unfolded flexible display in a plane state.

SUMMARY OF THE INVENTION

Accordingly, the present invention is directed to provide a foldable display apparatus that substantially obviates one or more problems due to limitations and disadvantages of the related art.

An aspect of the present invention is directed to provide a foldable display apparatus which can maintain a bending part of an unfolded flexible display in a plane state.

Another aspect of the present invention is directed to provide a foldable display apparatus for minimizing a bending stress applied to a bending part of a display panel.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a foldable display apparatus including: a display panel arranged in folded or unfolded position with respect to a bending part which is defined in a display area displaying an image; a first panel supporting part configured to support a first side of the display panel; a second panel supporting part configured to support a second side of the display panel; a first lower housing configured to rotatably support a first side of the first panel supporting part; a second lower housing configured to rotatably support a first side of the second panel supporting part; and a connection housing configured to overlap the bending part, and movably support a second side of each of the first and second panel supporting parts.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Figure 1:
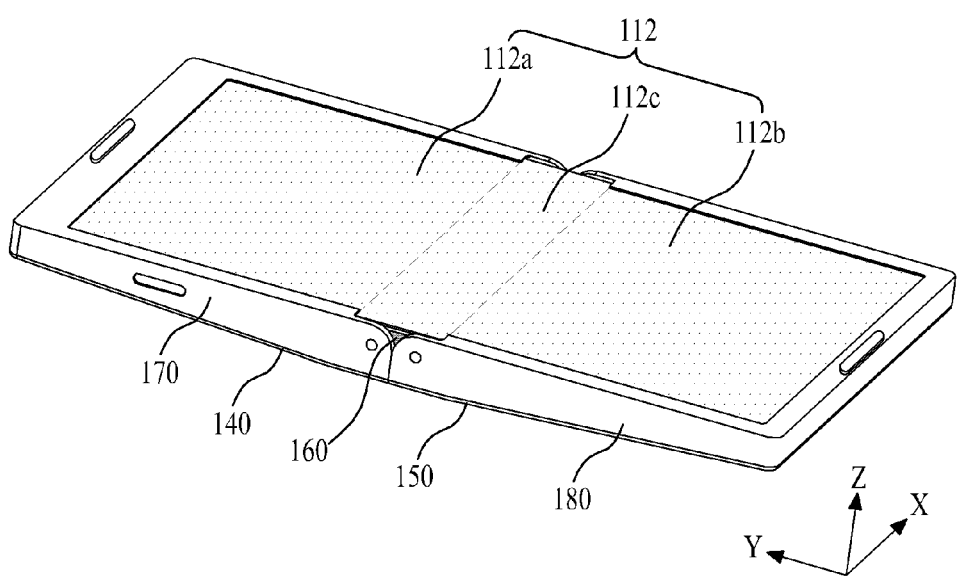
FIG. 1 is a perspective view illustrating a foldable display apparatus according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "on" should be construed as including a case where one element is formed at a top of another element and moreover a case where a third element is disposed therebetween.

Hereinafter, exemplary embodiments of a foldable display apparatus according to the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

Figure 2:
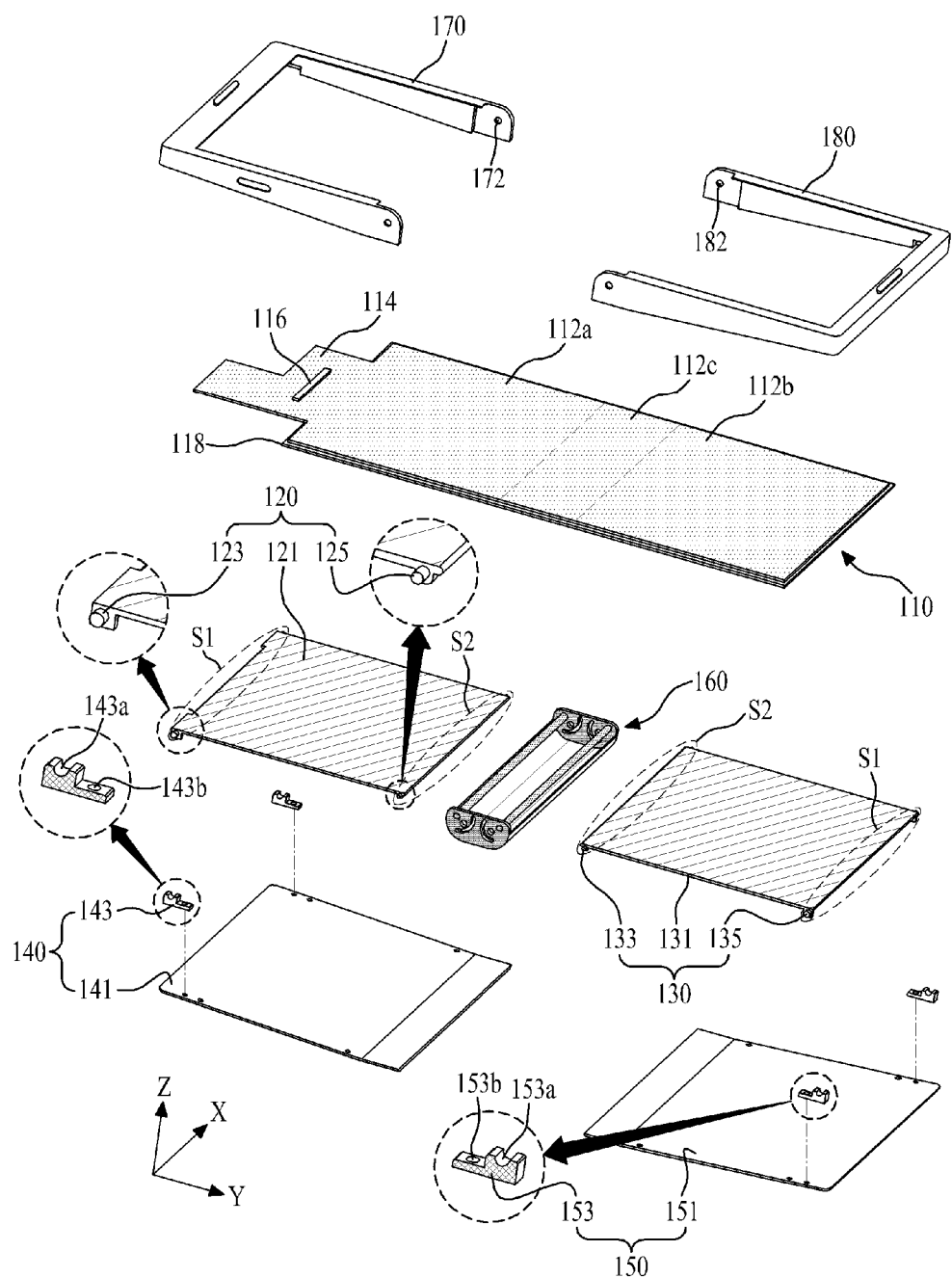
FIG. 2 is an exploded perspective view describing the foldable display apparatus of FIG. 1.

FIG. 1 is a perspective view illustrating a foldable display apparatus according to an embodiment of the present invention, and FIG. 2 is an exploded perspective view for describing the foldable display apparatus of FIG. 1.

Referring to FIGS. 1 and 2, the foldable display apparatus according to an embodiment of the present invention includes a display panel 110, first and second panel supporting parts 120 and 130, first and second lower housings 140 and 150, a connection housing 160, and first and second upper housings 170 and 180.

The display panel 110 may be a flexible display panel using a flexible substrate. For example, the display panel 110 may be a flexible organic light emitting display panel, a flexible electrophoretic display panel, a flexible liquid crystal display panel, or a flexible electro-wetting display panel.

The display panel 110 includes a flexible substrate, which includes a pixel array including a plurality of pixels for displaying an image, and a cover member which is provided on a flexible substrate to cover the pixel array.

The flexible pixel array substrate may be formed of a plastic material. For example, the flexible pixel array substrate formed of a plastic material may be formed of at least one selected from polyimide (PI), polyethyleneterephthalate (PET), polyethylenapthanate (PEN), polycarbonate (PC), polynorborneen (PNB), and polyethersulfone (PES).

Each of the plurality of pixels includes a display device that displays an image corresponding to an image signal. Here, the display device may be an organic light emitting device, a liquid crystal display device, an electrophoretic device, or an electro-wetting display device.

When the display device is the organic light emitting device or the electrophoretic device, the cover member according to an embodiment is formed on a flexible substrate to cover a pixel array, and may be a flexible encapsulating substrate or an encapsulating layer. When the display device is the liquid crystal display device, the electro-wetting display device, or the electrophoretic device, a cover member according to another embodiment may be a flexible color filter substrate that includes a color filter corresponding to a pixel.

In addition, the display panel 110 may further include a polarizing film attached to the cover member, but the polarizing film may be omitted for a flexibility of the display panel 110.

The foldable display apparatus according to an embodiment of the present invention may further include a touch screen (not shown) for a user interface using a user's touch. The touch screen may be attached onto the display panel 110, or may be built into the display panel 110 at the same with a process of forming the pixel array.

The display panel 110 includes a display area 112 including the plurality of pixels. The display area 112 may become a display screen that displays a certain image according to driving of a panel driver (not shown). The display area 112 may be divided into a first area 112a, a second area 112b, and a bending part 112c.

The first area 112a is an area between the bending part 112c and one short side of the display panel 110 in the display area 112, and may be defined as an upper area of the display area 112. When the display panel 110 is folded, the first area 112a may be always maintained in a plane state (or a horizontal state) without being folded.

The second area 112b is an area between the bending part 112c and the other short side of the display panel 110 in the display area 112, and may be defined as a lower area of the display area 112. When the display panel 110 is folded, the second area 112b may be always maintained a plane state (or a horizontal state) without being folded.

The bending part 112c may be as a middle area between the first area 112a and the second area 112b in the display area 112. When the display panel 110 is folded, the bending part 112c is unfolded in a plane state between the first area 112a and the second area 112b, and thus, the display area 112 is a wide screen having a plane state. When the display panel 110 is folded, the bending part 112c is bent in a curved shape between the first area 112a and the second area 112b so that the first area 112a directly faces the second area 112b, and thus, the display area 112 is folded.

The display panel 110 includes a signal applying unit 114 that extends from an edge of the first area 112a to have a certain width and length. A plurality of link lines, connected to a signal line provided in the pixel array, are provided in the signal applying unit 114. The signal applying unit 114 is bent toward a rear surface of the first panel supporting part 120 to surround a first side of the first panel supporting part 120, and is connected to a system driver (not shown) which is disposed on the first low housing 140. A driving integrated circuit (IC) 116, which drives a pixel provided in the display area 112 on the basis of a pixel driving signal and a data signal which are provided from the system driver, is mounted on the signal applying unit 114.

The display panel 110 may be attached to a flexible supporting plate 118. The flexible supporting plate 118 is attached to an entire rear surface of the display panel 110, and maintains the display panel 110, which is flexible, in a flat state. The flexible supporting plate 118 may be omitted depending on a flexible characteristic of a flexible substrate.

The first panel supporting part 120 supports the first area 112a of the display panel 110. A first side S1 of the first panel supporting part 120 is rotatably coupled to the first lower housing 140, and a second side S2 of the first panel supporting part 120 parallel to the first side S1 is movably coupled to the connection housing 160. When the display panel 110 is unfolded, the second side S2 supports one side of the bending part 112c.

The first panel supporting part 120 according to an embodiment includes a first plate 121, a pair of first rotation shafts 123, and a pair of first moving shafts 125.

The first plate 121 is coupled to a first area (i.e., a first rear area) of the display panel 110, and overlaps one side of the bending part 112c. Here, a partial area of the first plate 121 which overlaps the first rear area of the display panel 110 is physically coupled to the first rear area of the display panel 110 by an adhesive member (not shown). The other area of the first plate 121 which overlaps the one side of the bending part 112c is not physically coupled to the display panel 110 for bending of the bending part 112c, and when the display panel 110 is unfolded, the other area of the first plate 121 supports one side of the bending part 112c.

The pair of first rotation shafts 123 protrude from a first side S1 of the first plate 121, more particularly, a first side edge of a long side of the first plate 121, to have a certain length, and thus may be provided in a cylindrical shape.

The pair of first moving shafts 125 protrude from a second side S2 of the first plate 121, more particularly, a second side edge of the long side of the first plate 121 adjacent to the connection housing 160, to have a certain length, and thus may be provided in a cylindrical shape.

The first rotation shaft 123 and the first moving shaft 125 are not provided to protrude from the first plate 121, and may be separate shaft members such as a pin or a shaft coupled to a corresponding long side of the first plate 121.

The first panel supporting part 120 swings with respect to the first rotation shaft 123 when the display panel 110 is folded and unfolded. Therefore, the second side S2 of the first panel supporting part 120 is moved to a supporting position for supporting one side of the bending part 112c according to sliding of the first moving shaft 125 based on the movement guide of the connection housing 160, or is moved to an avoiding position in order for the bending part 112c to be bent in a curved shape.

The second panel supporting part 130 supports the second area 112b of the display panel 110. A first side S1 of the second panel supporting part 130 is rotatably coupled to the second lower housing 150, and a second side S2 of the second panel supporting part 130 parallel to the first side S1 is movably coupled to the connection housing 160. When the display panel 110 is unfolded, the second side S2 supports the other side of the bending part 112c.

The second panel supporting part 130 according to an embodiment includes a second plate 131, a pair of second rotation shafts 133, and a pair of second moving shafts 135.

The second plate 131 is coupled to a second area (i.e., a second rear area) of the display panel 110, and overlaps the other side of the bending part 112c. Here, a partial area of the second plate 131 which overlaps the second rear area of the display panel 110 is physically coupled to the second rear area of the display panel 110 by an adhesive member (not shown). The other area of the second plate 131 which overlaps the other side of the bending part 112c is not physically coupled to the display panel 110 for bending of the bending part 112c, and when the display panel 110 is unfolded, the other area of the second plate 131 supports the other side of the bending part 112c.

The pair of second rotation shafts 133 protrude from a first side S1 of the second plate 131, more particularly, a first side edge of a long side of the second plate 131, to have a certain length, and thus may be provided in a cylindrical shape.

The pair of second moving shafts 135 protrude from a second side S2 of the second plate 131, more particularly, a second side edge of the long side of the second plate 131 adjacent to the connection housing 160, to have a certain length, and thus may be provided in a cylindrical shape.

The second rotation shaft 133 and the second moving shaft 135 are not provided to protrude from the second plate 131, and may be separate shaft members such as a pin or a shaft coupled to a corresponding long side of the second plate 131.

The second panel supporting part 130 swings with respect to the second rotation shaft 133 when the display panel 110 is folded and unfolded. Therefore, the second side S2 of the second panel supporting part 130 is moved to a supporting position for supporting one side of the bending part 112c according to sliding of the second moving shaft 135 based on the movement guide of the connection housing 160, or is moved to an avoiding position in order for the bending part 112c to be bent in a curved shape.

The first lower housing 140 rotatably supports the first side S1 of the first panel supporting part 120, and covers a bottom of the first panel supporting part 120. The first lower housing 140 according to an embodiment includes a first lower cover 141 and a pair of first shaft supporting bodies 143.

The first lower cover 141 is coupled to the first upper housing 170 by a coupling member (not shown) such as a screw, and covers the bottom of the first panel supporting part 120 and one side of the connection housing 160.

The pair of first shaft supporting bodies 143 are coupled to a first side edge of the first lower cover 141 in parallel to respectively overlap the pair of first rotation shafts 123 which are provided at the first panel supporting part 120, and thus rotatably supports a corresponding first rotation shaft 123. Each of the pair of first shaft supporting bodies 143 according to an embodiment includes a first shaft supporting groove 143a that supports the first rotation shaft 123 so as to be rotated at a fixed position. Here, the first shaft supporting groove 143a may be recessed to have a semicircular cross-sectional surface, or may be provided in a hole shape into which the first rotation shaft 123 is inserted. The pair of first shaft supporting bodies 143 is coupled to the first lower cover 141 by a coupling member (not shown), such as a screw coupled to the first lower cover 141, through a first coupling hole 143b which is provided adjacent to the first shaft supporting groove 143a, and rotatably supports the first rotation shaft 123.

The second lower housing 150 rotatably supports the first side S1 of the second panel supporting part 130, and covers a bottom of the second panel supporting part 130. The second lower housing 150 according to an embodiment includes a second lower cover 151 and a pair of second shaft supporting bodies 153.

The second lower cover 151 is coupled to the second upper housing 180 by a coupling member (not shown) such as a screw, and covers the bottom of the second panel supporting part 130 and the other side of the connection housing 160.

The pair of second shaft supporting bodies 153 are coupled to a first side edge of the second lower cover 151 in parallel to respectively overlap the pair of second rotation shafts 133 which are provided at the second panel supporting part 130, and thus rotatably supports a corresponding second rotation shaft 133. Each of the pair of second shaft supporting bodies 153 according to an embodiment includes a second shaft supporting groove 153a that supports the second rotation shaft 133 so as to be rotated at a fixed position. Here, the second shaft supporting groove 153a may be recessed to have a semicircular cross-sectional surface, or may be provided in a hole shape into which the second rotation shaft 133 is inserted. The pair of second shaft supporting bodies 153 is coupled to the second lower cover 151 by a coupling member (not shown), such as a screw coupled to the second lower cover 151, through a second coupling hole 153b which is provided adjacent to the second shaft supporting groove 153a, and rotatably supports the second rotation shaft 133.

Figure 3:
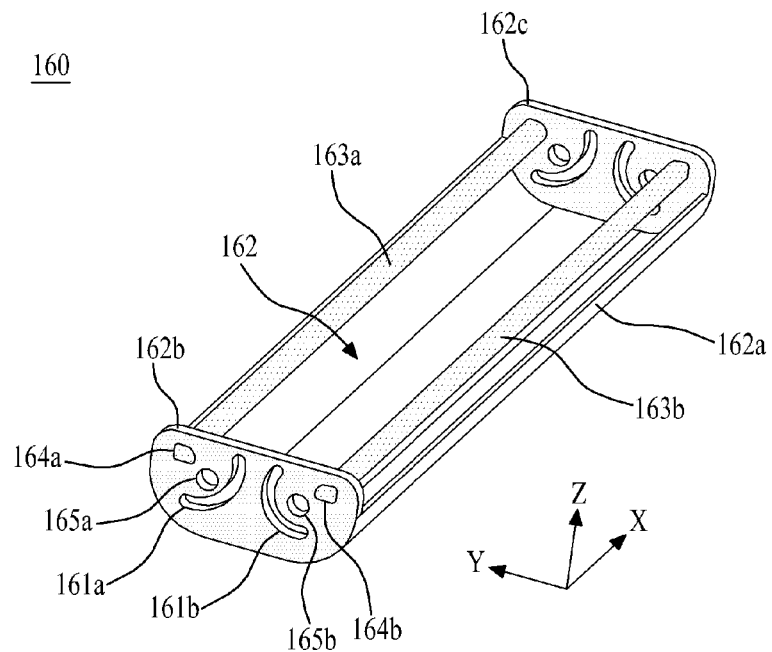
FIG. 3 is a perspective view illustrating a connection housing of FIG. 2.
Figure 4:
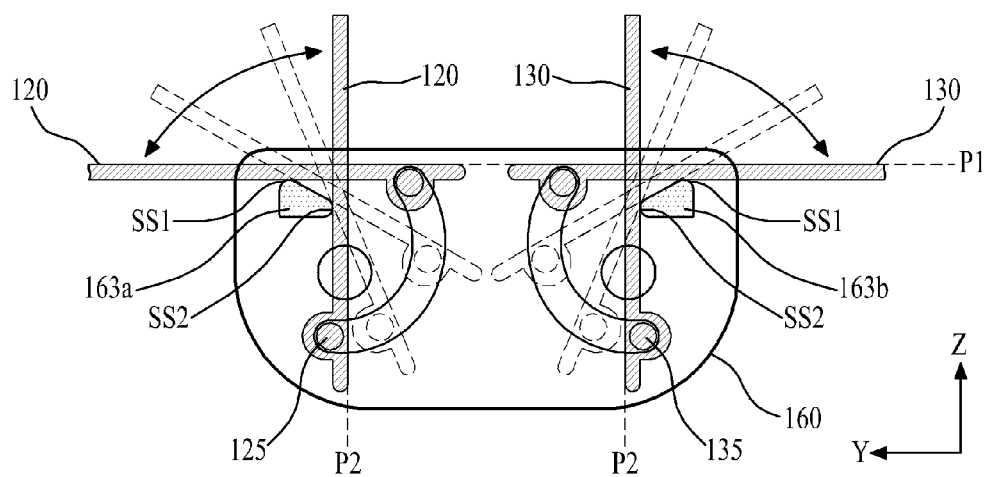
FIG. 4 is a diagram illustrating a movement of a panel supporting part by a slot illustrated in FIG. 3.

The connection housing 160 is connected between the first and second panel supporting parts 120 and 130 to overlap the bending part 112c of the display panel 110, and guides moving of the second side S2 of the first panel supporting part 120 and the second side S2 of the second panel supporting part 130. Also, the connection housing 160 rotatably supports the first and second upper housings 170 and 180. The connection housing 160 according to an embodiment, as illustrated in FIGS. 2 to 4, includes a first slot 161a, a second slot 161b, and an accommodating part 162.

The first slot 161a guides the second side S2 of the first panel supporting part 120 to move between a supporting position P1 and an avoiding position P2. The first slot 161a may be provided in a curved shape, and the first moving shaft 125 of the first panel supporting part 120 is slidably inserted into and disposed in the first slot 161a.

The second slot 161b guides the second side S2 of the second panel supporting part 130 to move between the supporting position P1 and the avoiding position P2. The second slot 161b may be provided in a curved shape, and the second moving shaft 135 of the second panel supporting part 130 is slidably inserted into and disposed in the second slot 161b.

The accommodating part 162 enables the second sides S2 of the first and second panel supporting parts 120 and 130 to move between the supporting position P1 and the avoiding position P2, and accommodates the bending part 112c that is bent in a curved shape. The accommodating part 162 according to an embodiment includes a floor cover 162a, a first side wall 162b, and a second side wall 162c.

The floor cover 162a overlaps the bending part 112c of the display panel 110, and both edges of the floor cover 162a in a length direction X are rounded to have a certain curvature.

The first side wall 162b is provided vertically to one short side of the floor cover 162a. First and second slots 161a and 161b are provided in the first side wall 162b. Here, the first and second slots 161a and 161b are provided to be symmetric with each other with respect to a central portion of the first side wall 162b.

The second side wall 162c is provided vertically to the other short side of the floor cover 162a in parallel with the first side wall 162b. First and second slots 161a and 161b are provided in the second side wall 162c. Here, the first and second slots 161a and 161b are provided to be symmetric with each other with respect to a central portion of the second side wall 162c.

An accommodating space, which is surrounded by both edges of the floor cover 162a and the first and second side walls 162b and 162c, is provided on the floor cover 162a.

The connection housing 160 according to an embodiment may further include first and second supporting members 163a and 163b.

The first supporting member 163a supports the first panel supporting part 120 (i.e., the second side S2 of the first plate 121) which is moved along the first slot 161a. The first supporting member 163a according to an embodiment is provided in a bar shape which is spanned between the first and second side walls 162b and 162c, and may include a first supporting surface SS1, which supports the second side S2 of the first plate 121 moved to the supporting position P1, and a second supporting surface SS2 supports the second side S2 of the first plate 121 moved to the avoiding position P2. First inserting holes 164a, into which both ends of the first supporting member 163a are respectively inserted, are respectively provided at the first and second side walls 162b and 162c.

The second supporting member 163b supports the second panel supporting part 130 (i.e., the second side S2 of the second plate 131) which is moved along the second slot 161b. The second supporting member 163b according to an embodiment is provided in a bar shape which is spanned between the first and second side walls 162b and 162c, and may include a second supporting surface SS1, which supports the second side S2 of the second plate 131 moved to the supporting position P1, and a second supporting surface SS2 that supports the second side S2 of the second plate 121 moved to the avoiding position P2. Second inserting holes 164b, into which both ends of the second supporting member 163b are respectively inserted, are respectively provided at the first and second side walls 162b and 162c.

When the display panel 110 is unfolded, the first supporting surface SS1 of each of the first and second supporting members 163a and 163b according to an embodiment supports the second side S2 of a corresponding plate 121 (131) moved to the supporting position P1, and thus maintains the corresponding plate 121 (131) in a plane state. When the display panel 110 is folded, the second supporting surface SS2 of each of the first and second supporting members 163a and 163b supports the second side S2 of a corresponding plate 121 (131) moved from the supporting position P1 to the avoiding position P2, and thus enables the corresponding plate 121 (131) to rotate in a vertical state. Each of the first and second supporting surfaces SS1 and SS2 acts as a support that supports a corresponding plate 121 (131), and enables the second side S2 of the corresponding plate 121 (131) to be slid between the supporting position P1 and the avoiding position P2 according to the guide of a corresponding slot 161a (161b).

Figure 5:
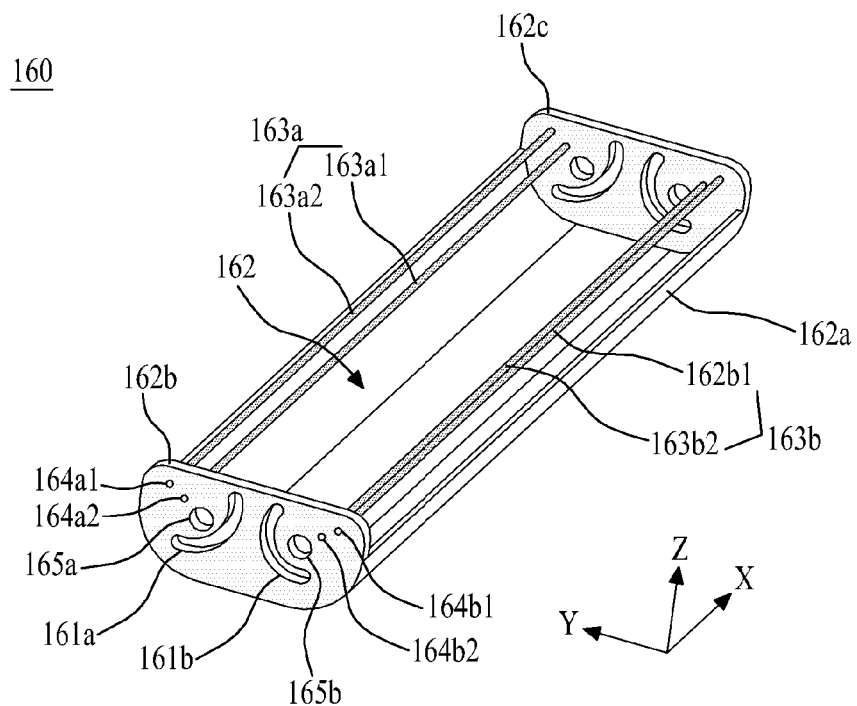
FIG. 5 is a perspective view describing a modification example of the connection housing of FIG. 2.

A first supporting member 163a according to another embodiment, as illustrated in FIG. 5, is provided in a pin shape which is spanned between the first and second side walls 162b and 162c, and may include a first supporting pin 163a1, which supports the second side S2 of the first plate 121 moved to the supporting position P1, and a second supporting pin 163a2 which supports the second side S2 of the first plate 121 moved to the avoiding position P2. Inserting holes 164a1 and 164a2, into which both ends of each of the first and second supporting pins 163a1 and 163a2 are respectively inserted, are respectively provided at the first and second side walls 162b and 162c.

A second supporting member 163b according to another embodiment is provided in a pin shape which is spanned between the first and second side walls 162b and 162c, and may include a second supporting pin 163b1, which supports the second side S2 of the second plate 131 moved to the supporting position P1, and a second supporting pin 163b2 which supports the second side S2 of the second plate 131 moved to the avoiding position P2. Inserting holes 164b1 and 164b2, into which both ends of each of the first and second supporting pins 163a1 and 163a2 are respectively inserted, are respectively provided at the first and second side walls 162b and 162c.

When the display panel 110 is unfolded, first supporting pins 163a1 and 163b1 of first and second supporting members 163a and 163b according to another embodiment respectively support the second sides S2 of corresponding plates 121 and 131 moved to the supporting position P1, and thus maintain the corresponding plates 121 and 131 in a plane state. When the display panel 110 is folded, second supporting pins 163a2 and 163b2 of the first and second supporting members 163a and 163b according to another embodiment respectively support the second sides S2 of corresponding plates 121 and 131 moved from the supporting position P1 to the avoiding position P2, and thus enable the corresponding plates 121 and 131 to rotate in a vertical state. Each of the first supporting pins 163a1 and 163b1 and the second supporting pins 163a2 and 163b2 acts as a support that supports a corresponding plate 121 (131), and enables the second side S2 of the corresponding plate 121 (131) to be slid between the supporting position P1 and the avoiding position P2 according to the guide of a corresponding slot 161a (161b).

As the second side S2 of the first panel supporting part 120 is supported by the first supporting member 163a, a space is provided between the first lower housing 140 and the first panel supporting part 120, and may be used as an accommodating space in which a driving system, various circuits, and a battery which are used to drive the display panel 110 are accommodated. Likewise, as the second side S2 of the second panel supporting part 130 is supported by the second supporting member 163b, a space is provided between the second lower housing 150 and the second panel supporting part 130, and may be used as an accommodating space.

Referring again to FIGS. 1 to 4, the first upper housing 170 coupled to the first lower housing 140, is rotatably coupled to a first side of the connection housing 160, and covers an edge of a first area of the display panel 110 except the bending part 112c. That is, the first upper housing 170 has a ⌐ -shaped cross-sectional surface which includes a front cover part and a side cover part, has a ⊂ -shape in plane, and surrounds a peripheral area and a side of the first area except the bending part 112c of the display panel 110. For example, a first side of the first upper housing 170 may be rotatably coupled to the first side of the connection housing 160 by a first pivot shaft member (not shown). To this end, a first shaft inserting hole 172 is provided at the first side of the first upper housing 170, and a first shaft inserting hole 165a is provided at the connection housing 160, namely, a first side of each of the first and second side walls 162b and 162c. A plurality of screw holes (not shown), which are coupled to a coupling member such as a screw passing through the first lower housing 140, are arranged at certain intervals at a bottom of the side cover part of the first upper housing 170. Therefore, the first upper housing 170 may rotate by 0 degrees to 90 degrees from the connection housing 160 with respect to a first pivot shaft. In addition, the first upper housing 170 covers an upper portion of the first rotation shaft 123 supported by the first shaft supporting body 143, and thus prevents the first rotation shaft 123 from deviating from the first shaft supporting body 143.

The second upper housing 180 coupled to the second lower housing 150, is rotatably coupled to a second side of the connection housing 160, and covers an edge of a second area except the bending part 112c of the display panel 110. That is, the second upper housing 180 has a ⌐ -shaped cross-sectional surface which includes a front cover part and a side cover part, has a ⊃ -shape in plane, and surrounds a peripheral area and a side of the second area except the bending part 112c of the display panel 110. For example, a first side of the second upper housing 180 may be rotatably coupled to the second side of the connection housing 160 by a second pivot shaft member (not shown). To this end, a second shaft inserting hole 182 is provided at the first side of the second upper housing 180, and a second shaft inserting hole 165b is provided at the connection housing 160, namely, a second side of each of the first and second side walls 162b and 162c. A plurality of screw holes (not shown), which are coupled to a coupling member such as a screw passing through the second lower housing 150, are arranged at certain intervals at a bottom of the side cover part of the second upper housing 180. Therefore, the second upper housing 180 may rotate by 90 degrees from the connection housing 160 with respect to a second pivot shaft. In addition, the second upper housing 180 covers an upper portion of the second rotation shaft 133 supported by the second shaft supporting body 153, and thus prevents the second rotation shaft 133 from deviating from the second shaft supporting body 153.

The first and second upper housings 170 and 180 rotate to face each other from the connection housing 160, and enable the display panel 110 to be folded with respect to the bending part 112c. Also, the first and second upper housings 170 and 180 rotate in a plane state (or a horizontal state) from the connection housing 160, and enable the display panel 110 to be unfolded.

Figure 6A:
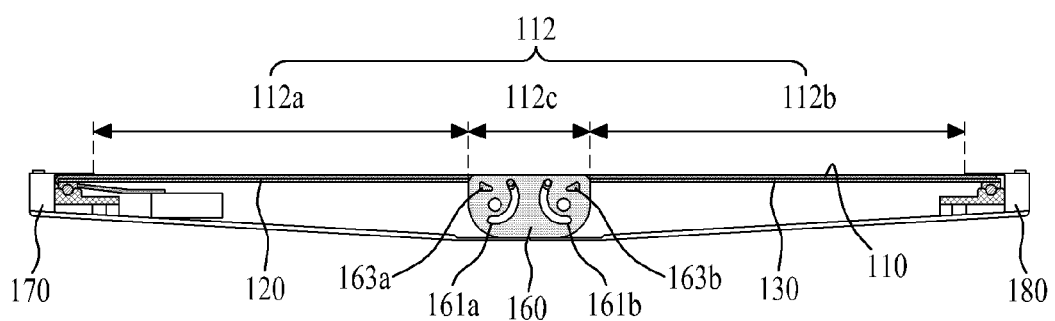
FIGS. 6A and 6B are cross-sectional views illustrating an unfolded display panel and a folded display panel in a foldable display apparatus according to an embodiment of the present invention.
Figure 6B:
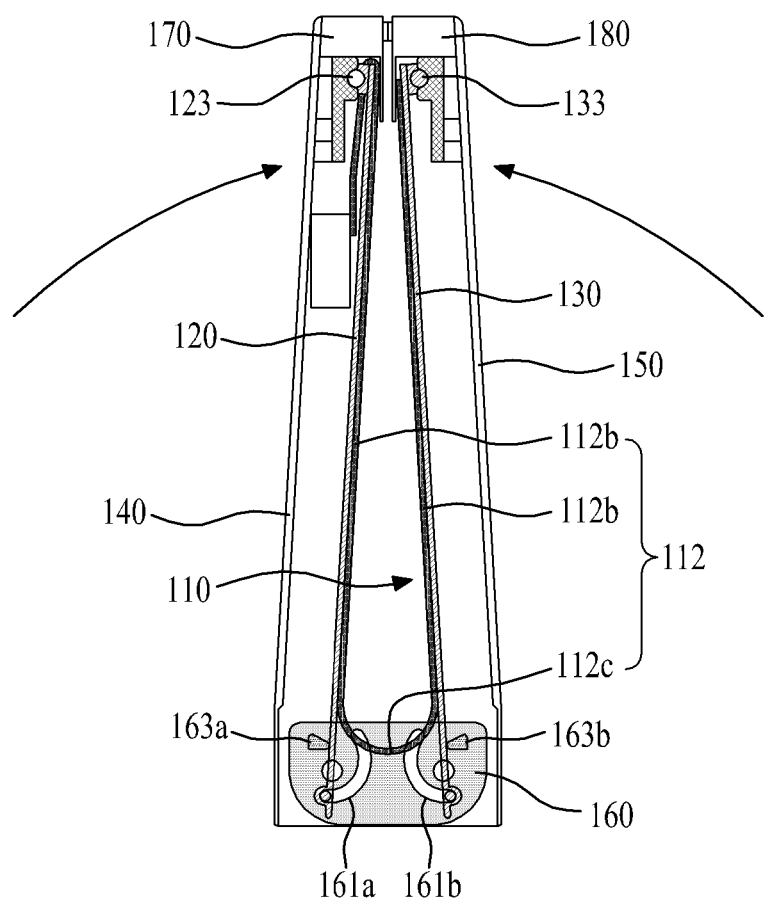

FIGS. 6A and 6B are cross-sectional views illustrating an unfolded display panel and a folded display panel in a foldable display apparatus according to an embodiment of the present invention.

Referring to FIGS. 4 and 6A, the display panel 110 rotates in a horizontal state where the first and second upper housings 170 and 180 face each other and then are separated from each other so as not to face each other, and thus is unfolded to a plane state, whereby the display area 112 of the display panel 110 is exposed to the outside to provide one wide screen.

In detail, when the first upper housing 170 rotates in a plane state, the second side S2 of the first panel supporting part 120 is up-slid to the supporting position P1 along the first slot 161a of the connection housing 160, and is supported by the first supporting surface SS1 of the first supporting member 163a. Therefore, the first panel supporting part 120 is switched to a horizontal state parallel to the first area 112a of the display panel 110, and supports one side of the bending part 112c.

Simultaneously, when the second upper housing 180 rotates in a plane state, the second side S2 of the second panel supporting part 130 is up-slid to the supporting position P1 along the second slot 161b of the connection housing 160, and is supported by the first supporting surface SS1 of the second supporting member 163b. Therefore, the second panel supporting part 130 is switched to a horizontal state parallel to the second area 112b of the display panel 110, and supports the other side of the bending part 112c.

Therefore, in the foldable display apparatus according to an embodiment of the present invention, when the display panel 110 is unfolded, the bending part 112c of the unfolded display panel 110 is stably supported by the second side S2 of each of the first and second panel supporting parts 120 and 130, and thus, the bending part 112c of the unfolded display panel 110 can be prevented from being recessed by an external force, thereby maintaining the unfolded display panel 110 in a plane state.

Referring to FIGS. 4 and 6B, the display panel 110 is symmetrically folded with respect to the bending part 112c when the first and second upper housings 170 and 180 rotate from a horizontal state to a vertical state to face each other, and thus, the display area 112 of the display panel 110 is hidden and protected by the first and second upper housings 170 and 180 which overlap to face each other, and is not exposed to the outside.

In detail, when the first upper housing 170 rotates from a horizontal state to a vertical state, the second side S2 of the first panel supporting part 120 is down-slid from the supporting position P1 to the avoiding position P2 along the first slot 161a of the connection housing 160, and is supported by the second supporting surface SS2 of the first supporting member 163a. Therefore, the first panel supporting part 120 rotates to be inclined toward the first lower cover 140 with respect to the first rotation shaft 123, and thus, the second side S2 of the first panel supporting part 120 retreats from the supporting position P1 to the first lower cover 140 so as not to obstruct bending of the bending part 112c.

Simultaneously, when the second upper housing 180 rotates from a horizontal state to a vertical state, the second side S2 of the second panel supporting part 130 is down-slid from the supporting position P1 to the avoiding position P2 along the second slot 161b of the connection housing 160, and is supported by the second supporting surface SS2 of the second supporting member 163b. Therefore, the second panel supporting part 130 rotates to be inclined toward the second lower cover 150 with respect to the second rotation shaft 133, and thus, the second side S2 of the second panel supporting part 130 retreats from the supporting position P1 to the second lower cover 150 so as not to obstruct bending of the bending part 112c.

Therefore, in the foldable display apparatus according to an embodiment of the present invention, when the display panel 110 is folded, the second side S2 of each of the first and second panel supporting parts 120 and 130 retreats toward the lower covers 140 and 150. Therefore, since the display panel 110 is folded, the bending part 112c is smoothly bent at a relatively high curvature, and is accommodated in the connection housing 160, thereby minimizing a bending stress applied to the bending part 112c.

Figure 7:
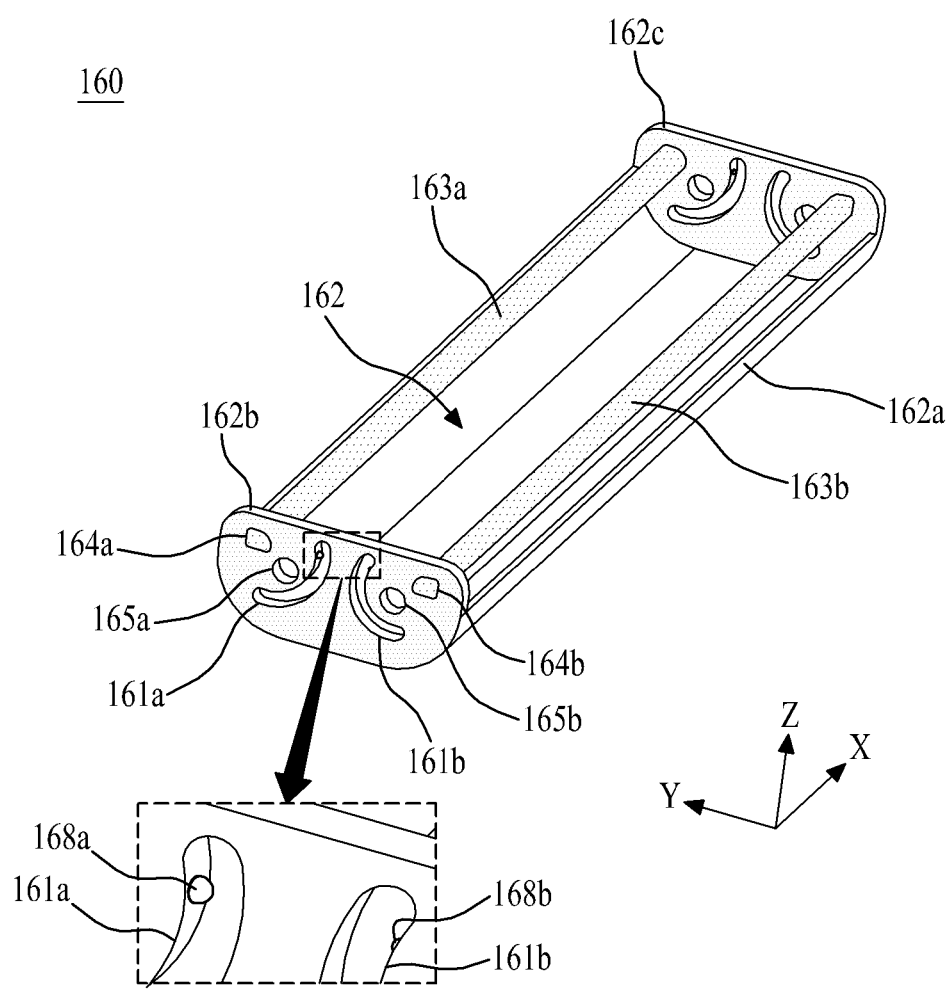
FIG. 7 is a diagram describing a modification example of a connection housing in a foldable display apparatus according to an embodiment of the present invention.
Figure 8:
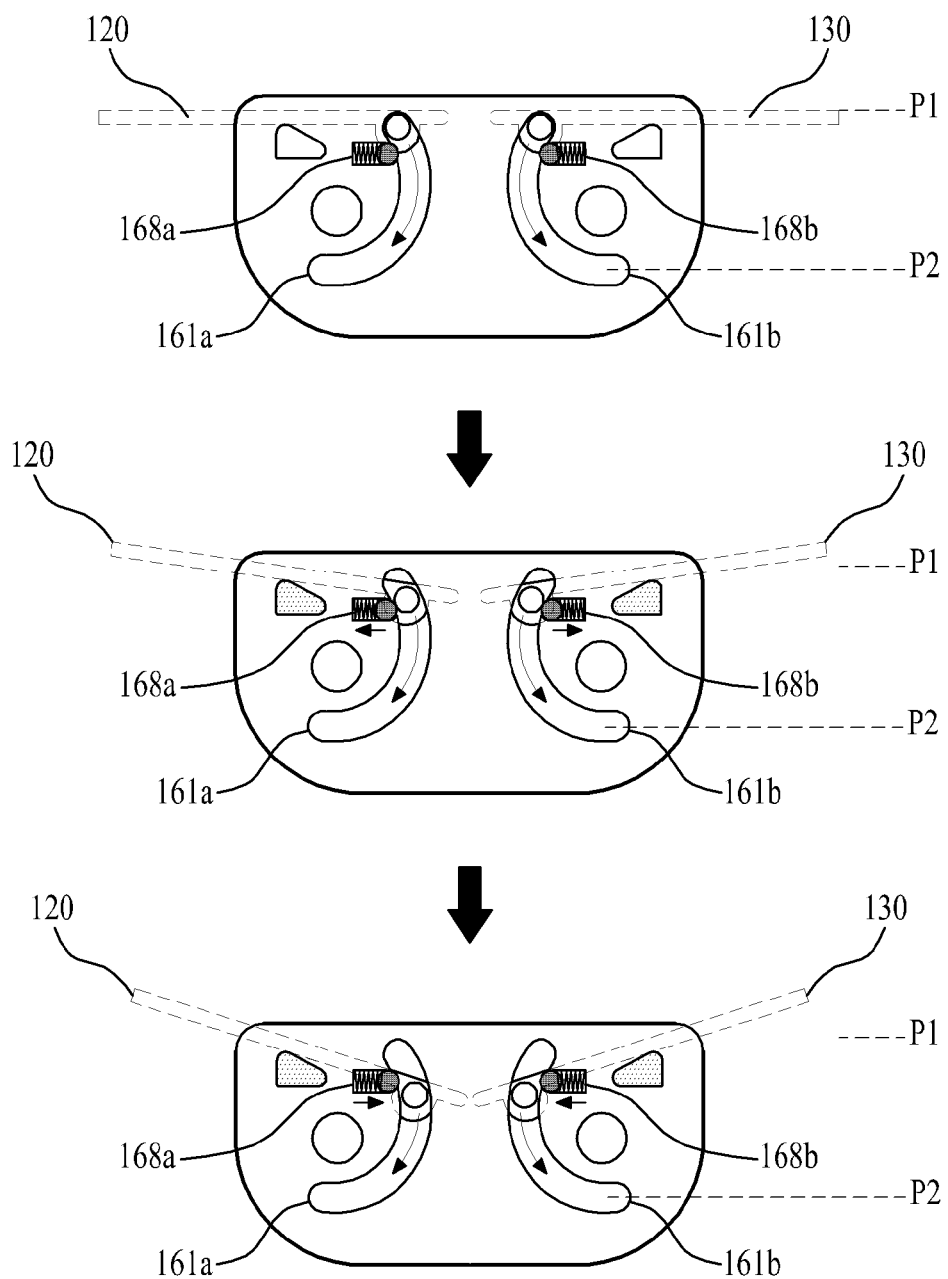
FIG. 8 is a diagram sequentially illustrating an operation of a movement binding member illustrated in FIG. 7.

FIG. 7 is a diagram describing a modification example of a connection housing in a foldable display apparatus according to an embodiment of the present invention, and FIG. 8 is a diagram sequentially illustrating an operation of a movement binding member illustrated in FIG. 7. Here, a movement binding member is additionally provided at the connection housing 160 of FIG. 3. Therefore, in the following description, only first and second movement binding members will be described.

Referring to FIGS. 7 and 8, the first movement binding member 168a is provided at a guide surface of the first slot 161a, and selectively binds moving of the second side S2 of the first panel supporting part 120 from the supporting position P1 to the avoiding position P2. For example, the first movement binding member 168a may include a ball spring that enables the first moving shaft 125 of the first panel supporting part 120 to be down-slid along the first slot 161a by using an elastic restoring force of a spring which is compressed by a certain or higher pressure. That is, when a bending force equal to or greater than a certain force is applied to the unfolded display panel 110, the first moving shaft 125 of the first panel supporting part 120 pushes a ball toward the spring, and is down-slid along the first slot 161a. Therefore, the first movement binding member 168a prevents the first area of the display panel 110, which is unfolded to a plane state, from being bent by a bending force equal to or less than a certain force.

The second movement binding member 168b is provided at a guide surface of the second slot 161b, and selectively binds moving of the second side S2 of the second panel supporting part 130 from the supporting position P1 to the avoiding position P2. For example, the second movement binding member 168b may include a ball spring that enables the second moving shaft 135 of the second panel supporting part 130 to be down-slid along the second slot 161b by using an elastic restoring force of a spring which is compressed by a certain or higher pressure. That is, when a bending force equal to or greater than a certain force is applied to the unfolded display panel 110, the second moving shaft 135 of the second panel supporting part 130 pushes a ball toward the spring, and is down-slid along the second slot 161b. Therefore, the second movement binding member 168b prevents the second area of the display panel 110, which is unfolded to a plane state, from being bent by a bending force equal to or less than a certain force.

Figure 9:
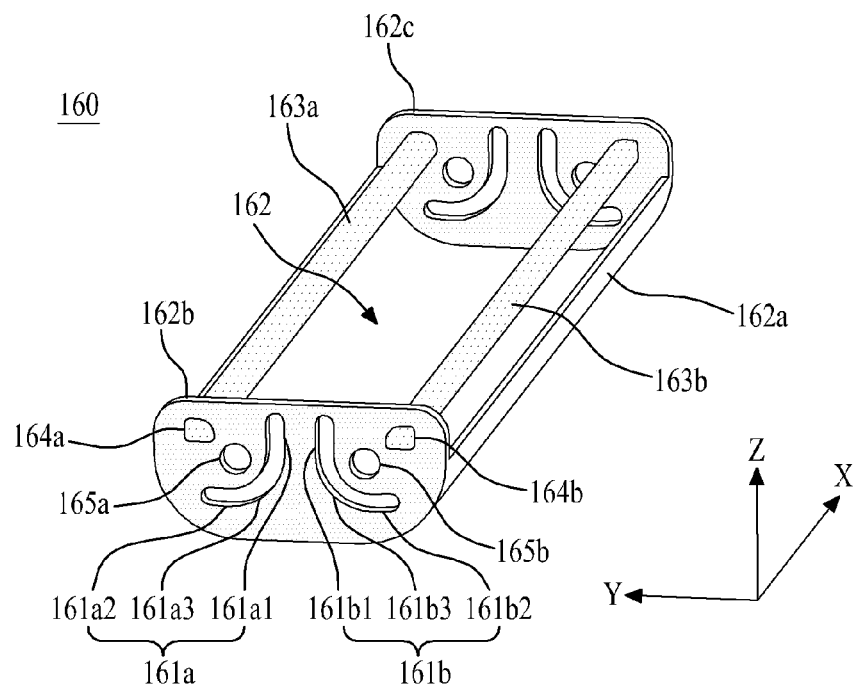
FIG. 9 is a diagram describing another modification example of a connection housing illustrated in FIG. 3 or 5.
Figure 10:
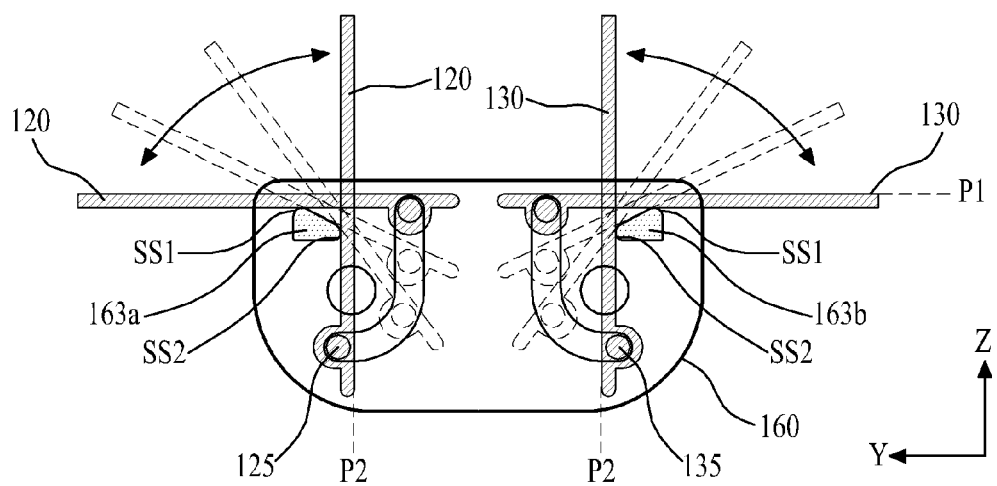
FIG. 10 is a diagram illustrating a movement of a panel supporting part by a slot illustrated in FIG. 9.

FIG. 9 is a diagram describing another modification example of a connection housing 160 illustrated in FIG. 3 or 5, and FIG. 10 is a diagram illustrating a movement of a panel supporting part by a slot illustrated in FIG. 9. Here, a shape of the slot of FIG. 3 or 5 is changed. Thus, in the following description, only first and second slots will be described.

Referring to FIGS. 9 and 10, a first slot 161a according to another embodiment is provided at each of the first and second side walls 162b and 162c to have a ⌐ -shape in which a corner is rounded. For example, the first slot 161a may include a first guide slot 161a1 which is provided along a first direction Z, a second guide slot 161a2 which is provided along a second direction Y intersecting the first direction Z, and a curved guide slot 161a3 that communicates with the first and second guide slots 161a1 and 161a2.

The first guide slot 161a1 extends in a vertical direction Z to have a certain length along the first direction Z, and guides the first moving shaft 125 of the first panel supporting part 120 so as to be slid in the vertical direction Z. The second guide slot 161a2 extends in a horizontal direction Y to have a certain length along the second direction Y, and guides the first moving shaft 125 of the first panel supporting part 120 so as to be slid in the horizontal direction Y. The curved guide slot 161a3 is provided in a curved shape to have a certain curvature between the first and second guide slots 161a1 and 161a2 and communicates the first guide slot 161a1 with the second guide slot 161a2, and thus, a direction of the first moving shaft 125 of the first panel supporting part 120 is switched between the vertical direction Z and the horizontal direction Y.

A second slot 161b according to another embodiment is provided at each of the first and second side walls 162b and 162c to have a L -shape in which a corner is rounded. For example, the second slot 161b may include a first guide slot 161b1 which is provided along the first direction Z, a second guide slot 161b2 which is provided along the second direction Y intersecting the first direction Z, and a curved guide slot 161b3 that communicates with the first and second guide slots 161b1 and 161b2.

The first guide slot 161b1 of the second slot 161b extends in the vertical direction Z to have a certain length along the first direction Z, and guides the second moving shaft 135 of the second panel supporting part 130 so as to be slid in the vertical direction Z. The second guide slot 161b2 of the second slot 161b extends in the horizontal direction Y to have a certain length along the second direction Y, and guides the second moving shaft 135 of the second panel supporting part 130 so as to be slid in the horizontal direction Y. The curved guide slot 161b3 of the second slot 161b is provided in a curved shape to have a certain curvature between the first and second guide slots 161b1 and 161b2 and communicates the first guide slot 161b1 with the second guide slot 161b2, and thus, a direction of the second moving shaft 135 of the second panel supporting part 130 is switched between the vertical direction Z and the horizontal direction Y.

Each of the first and second slots 161a and 161b according to another embodiment includes a guide slot which is provided along the vertical direction Z and the horizontal direction Y. Therefore, when the display panel 110 is folded or unfolded, the first and second slots 161a and 161b respectively slide the panel supporting parts 120 and 130 along a length direction Y of the display panel 110. Accordingly, a bending stress applied to the bending part 112c due to bending of the bending part 112c can be minimized and dispersed, thereby enhancing a reliability of the display panel 110.

A plurality of movement binding members 168a and 168b including a ball spring, as illustrated in FIGS. 7 and 8, may be respectively provided at the first guide slots 161a1 and 161b1 of the first and second slots 161a and 161b according to another embodiment. In this case, the present invention can prevent the display panel 110, unfolded to a plane state, from being bent by a bending force equal to or less than a certain force, and the unfolded display panel 110 may be folded by a small bending force equal to or greater than a movement binding force of the movement binding members 168a and 168b.

In addition, since a shape of each of the first and second slots 161a and 161b according to another embodiment is changed, when the first side S1 of each of the first and second panel supporting parts 120 and 130 rotates at a fixed position, the second side S2 of each of the first and second panel supporting parts 120 and 130 does not move along a corresponding slot 161a (161b). Therefore, it is required to change a shape of each of the first shaft supporting body 143 of the first lower housing 140 and the second shaft supporting body 153 of the second lower housing 150.

Figure 11:
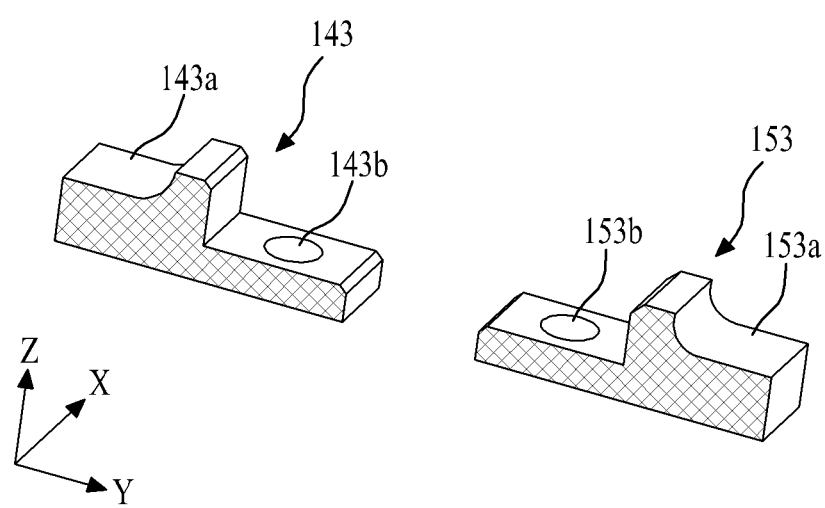
FIG. 11 is a perspective view describing a modification example of a shaft supporting body illustrated in FIG. 2.

Referring to FIG. 11, a pair of first shaft supporting bodies 143 and a pair of second shaft supporting bodies 153 according to another embodiment respectively support the rotation shafts 123 and 133 of the panel supporting parts 120 and 130 so that the rotation shafts 123 and 133 of the panel supporting parts 120 and 130 move while rotating.

Each of the pair of first shaft supporting bodies 143 includes a first shaft supporting groove 143a that supports the first rotation shaft 123 so that the first rotation shaft 123 moves while rotating when the first moving shaft 125 of the first panel supporting part 120 moves at the guide slots 161a1, 161a2 and 161a3 of the first slot 161a. Here, the first shaft supporting groove 143a includes a movement guide surface which is provided to have a certain length with respect to a movement direction Y of the first rotation shaft 123. The pair of first shaft supporting bodies 143 are coupled to the first lower cover 141 by a coupling member (not shown) such as a screw which is coupled to the first lower cover 141 through the first coupling hole 143b provided adjacent to the first shaft supporting groove 143a. Each of the pair of first shaft supporting bodies 143 supports the first rotation shaft 123 so that the first rotation shaft 123 moves while rotating, and thus enables the first panel supporting part 120 to be slid along a trajectory of the first slot 161a, thereby reducing or dispersing a stress applied to the first area (i.e., the bending part 112c) of the display panel 110.

Each of the pair of second shaft supporting bodies 153 includes a second shaft supporting groove 153a that supports the second rotation shaft 133 so that the second rotation shaft 133 moves while rotating when the second moving shaft 135 of the second panel supporting part 130 moves at the guide slots 161b1, 161b2 and 161b3 of the second slot 161b. Here, the second shaft supporting groove 153a includes a movement guide surface which is provided to have a certain length with respect to a movement direction Y of the second rotation shaft 133. The pair of second shaft supporting bodies 153 are coupled to the second lower cover 151 by a coupling member (not shown) such as a screw which is coupled to the second lower cover 151 through the second coupling hole 153b provided adjacent to the second shaft supporting groove 153a. Each of the pair of second shaft supporting bodies 153 supports the second rotation shaft 133 so that the second rotation shaft 133 moves while rotating, and thus enables the second panel supporting part 130 to be slid along a trajectory of the second slot 161b, thereby reducing or dispersing a stress applied to the second area of the display panel 110.

In the foldable display apparatus including the first and second slots 161a and 161b, the pair of first shaft supporting bodies 143, and the pair of second shaft supporting bodies 153, except a movement path of the second side S2 of each of the panel supporting parts 120 and 130 which are slid at the slots 161a and 161b and that the first sides S1 of the panel supporting parts 120 and 130 rotate while moving at the pair of first shaft supporting bodies 143 and the pair of second shaft supporting bodies 153, the display panel 1110 is unfolded or folded as described above, and thus, a repetitive description is not provided.

As described above, the present invention stably supports a bending part of an unfolded display panel, and thus prevents the bending part of the unfolded display panel from being recessed by an external force, thereby maintaining the unfolded display panel in a plane state. Also, the present invention bends the bending part of the display panel at a relatively high curvature when the display panel is folded, and thus minimizes a bending stress applied to the bending part, thereby preventing a reliability of the foldable display apparatus from being reduced due to the bending stress.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A foldable display apparatus comprising:
    a display panel arranged in a folded or unfolded position with respect to a bending part which is defined in a display area that displays an image;
    a first panel supporting part configured to support a first side of the display panel;
    a second panel supporting part configured to support a second side of the display panel;
    a first lower housing configured to rotatably support a first side of the first panel supporting part;
    a second lower housing configured to rotatably support a first side of the second panel supporting part; and
    a connection housing configured to overlap the bending part, and movably support a second side of each of the first and second panel supporting parts,
    wherein the connection housing comprises:
    a first slot configured to movably support a second side of the first panel supporting part;
    a second slot configured to movably support a second side of the second panel supporting part;
    an accommodating part configured to accommodate the bending part which is bent in a curved shape;
    a first supporting member configured to support the second side of the first panel supporting part which is moved along the first slot; and
    a second supporting member configured to support the second side of the second panel supporting part which is moved along the second slot.

2. The foldable display apparatus of claim 1, wherein each of the first and second supporting members comprises:
    a first supporting surface configured to support the second side of a corresponding panel supporting part which is moved to a supporting position for supporting the bending part; and a second supporting surface configured to support the second side of a corresponding panel supporting part which is moved to an avoiding position for the bending part to be bent in a curved shape.

3. The foldable display apparatus of claim 1, wherein each of the first and second supporting members comprises:
a first supporting pin configured to support the second side of a corresponding panel supporting part which is moved to a supporting position for supporting the bending part; and
a second supporting pin configured to support the second side of a corresponding panel supporting part which is moved to an avoiding position for the bending part to be bent in a curved shape.

4. The foldable display apparatus of claim 1, wherein,
the first panel supporting part comprises:
a first plate configured to overlap a first area of the display panel and one side of the bending part;
a first rotation shaft provided at a first side of the first plate, and supported by the first lower housing; and
a first moving shaft provided at a second side of the first plate, and inserted into the first slot, and
the second panel supporting part comprises:
a second plate configured to overlap a second area of the display panel and the other side of the bending part;
a second rotation shaft provided at a first side of the second plate, and supported by the second lower housing; and
a second moving shaft provided at a second side of the second plate, and inserted into the second slot.

5. The foldable display apparatus of claim 4, wherein the connection housing further comprises:
a first movement binding member provided at the first slot, and configured to selectively bind moving of the first moving shaft; and
a second movement binding member provided at the second slot, and configured to selectively bind moving of the second moving shaft.

6. The foldable display apparatus of claim 5, wherein each of the first and second movement binding members comprises a ball spring.

7. The foldable display apparatus of claim 5, wherein,
the first lower housing comprises a first shaft supporting body configured to support the first rotation shaft, and
the second lower housing comprises a second shaft supporting body configured to support the second rotation shaft.

8. The foldable display apparatus of claim 7, wherein,
each of the first and second slots is provided in a curved shape, and
each of the first and second rotation shafts rotates at a position supported by a corresponding shaft supporting body.

9. The foldable display apparatus of claim 8, wherein the connection housing further comprises:
a first movement binding member provided at the first slot, and configured to selectively bind moving of the first moving shaft; and
a second movement binding member provided at the second slot, and configured to selectively bind moving of the second moving shaft.

10. The foldable display apparatus of claim 9, wherein each of the first and second movement binding members comprises a ball spring.

11. The foldable display apparatus of claim 7, wherein, each of the first and second slots comprises:
a first guide slot provided along a first direction;
a second guide slot provided along a second direction intersecting the first direction; and
a curved guide slot configured to communicate the first guide slot with the second guide slot, and
each of the first and second rotation shafts is moved at a corresponding shaft supporting body.

12. The foldable display apparatus of claim 11, wherein the connection housing further comprises:
a first movement binding member provided at the first slot, and configured to selectively bind moving of the first moving shaft; and
a second movement binding member provided at the second slot, and configured to selectively bind moving of the second moving shaft.

13. The foldable display apparatus of claim 12, wherein each of the first and second movement binding members comprises a ball spring.

14. A foldable display apparatus comprising:
a display panel arranged in a folded or unfolded position with respect to a bending part which is defined in a display area that displays an image;
a first panel supporting part configured to support a first side of the display panel;
a second panel supporting part configured to support a second side of the display panel;
a first lower housing configured to rotatably support a first side of the first panel supporting part;
a second lower housing configured to rotatably support a first side of the second panel supporting part;
a connection housing configured to overlap the bending part, and movably support a second side of each of the first and second panel supporting parts;
a first upper housing configured to cover an edge of a first area except a bending part of the display panel, coupled to the first lower housing, and rotatably coupled to a first side of the connection housing; and
a second upper housing configured to cover an edge of a second area except the bending part of the display panel, coupled to the second lower housing, and rotatably coupled to a second side of the connection housing.

15. The foldable display apparatus of claim 14, wherein the connection housing comprises:
a first slot configured to movably support a second side of the first panel supporting part;
a second slot configured to movably support a second side of the second panel supporting part; and
an accommodating part configured to accommodate the bending part which is bent in a curved shape.

16. The foldable display apparatus of claim 15, wherein the connection housing comprises:
a first supporting member configured to support the second side of the first panel supporting part which is moved along the first slot; and
a second supporting member configured to support the second side of the second panel supporting part which is moved along the second slot.

17. The foldable display apparatus of claim 16, wherein each of the first and second supporting members comprises:
a first supporting surface configured to support the second side of a corresponding panel supporting part which is moved to a supporting position for supporting the bending part; and
a second supporting surface configured to support the second side of a corresponding panel supporting part which is moved to an avoiding position for the bending part to be bent in a curved shape.

18. The foldable display apparatus of claim 16, wherein each of the first and second supporting members comprises:
- a first supporting pin configured to support the second side of a corresponding panel supporting part which is moved to a supporting position for supporting the bending part; and
- a second supporting pin configured to support the second side of a corresponding panel supporting part which is moved to an avoiding position for the bending part to be bent in a curved shape.

19. The foldable display apparatus of claim 15, wherein the connection housing further comprises:
- a first movement binding member provided at the first slot, and configured to selectively bind moving of the second side of the first panel supporting parts; and
- a second movement binding member provided at the second slot, and configured to selectively bind moving of the second side of the second panel supporting parts.

20. The foldable display apparatus of claim 15, wherein each of the first and second slots is provided in a curved shape.

* * * * *